(12) United States Patent
Yang

(10) Patent No.: US 8,772,057 B1
(45) Date of Patent: Jul. 8, 2014

(54) INLINE METHOD TO MONITOR ONO STACK QUALITY

(75) Inventor: Yu Yang, Bloomington, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 214 days.

(21) Appl. No.: 13/107,853

(22) Filed: May 13, 2011

(51) Int. Cl.
*H01L 21/66* (2006.01)
(52) U.S. Cl.
USPC .............................. 438/17; 257/324; 438/591
(58) Field of Classification Search
USPC ..................................... 257/324; 438/17, 591
See application file for complete search history.

(56) References Cited

U.S. PATENT DOCUMENTS

| | | | |
|---|---|---|---|
| 6,011,404 A * | 1/2000 | Ma et al. | 324/754.05 |
| 6,436,768 B1 | 8/2002 | Yang et al. | |
| 6,440,797 B1 | 8/2002 | Wu et al. | |
| 6,465,303 B1 | 10/2002 | Ramsbey et al. | |
| 6,538,462 B1 * | 3/2003 | Lagowski et al. | 324/762.05 |
| 6,617,179 B1 | 9/2003 | Kim | |
| 6,674,138 B1 | 1/2004 | Halliyal et al. | |
| 7,005,349 B2 | 2/2006 | Lee et al. | |
| 7,037,781 B2 | 5/2006 | Choi et al. | |
| 7,248,062 B1 * | 7/2007 | Samsavar et al. | 324/754.23 |
| 7,250,337 B2 | 7/2007 | Lee | |
| 7,288,452 B2 | 10/2007 | Lee | |
| 7,560,764 B2 | 7/2009 | Park et al. | |
| 7,588,986 B2 | 9/2009 | Jung | |
| 7,893,703 B2 * | 2/2011 | Rzepiela et al. | 324/754.24 |
| 2002/0121914 A1 * | 9/2002 | Chacon et al. | 324/765 |
| 2004/0077110 A1 * | 4/2004 | Kang et al. | 438/14 |
| 2006/0262598 A1 | 11/2006 | Eitan | |
| 2006/0267622 A1 * | 11/2006 | Lagowski et al. | 324/765 |
| 2007/0013398 A1 * | 1/2007 | Rathei | 324/765 |
| 2009/0032862 A1 | 2/2009 | Maayan et al. | |
| 2009/0032863 A1 | 2/2009 | Levy et al. | |
| 2009/0166717 A1 | 7/2009 | Jung | |
| 2009/0179253 A1 | 7/2009 | Levy et al. | |
| 2009/0243001 A1 | 10/2009 | Ramkumar et al. | |
| 2009/0291550 A1 | 11/2009 | Chen | |
| 2010/0311217 A1 | 12/2010 | Wu et al. | |
| 2011/0212612 A1 * | 9/2011 | Choi et al. | 438/591 |
| 2011/0248332 A1 | 10/2011 | Levy et al. | |

FOREIGN PATENT DOCUMENTS

| | | |
|---|---|---|
| CN | 101577250 A1 | 11/2009 |
| KR | 100851917 A1 | 8/2008 |

OTHER PUBLICATIONS

"Multi-level vertical channel SONOS nonvolatile memory on SOI," copyright 2002, downloaded from http://ieeexplore.ieee.org/xpl/freeabs_all.jsp?arnumber=1015455 on Aug. 11, 2011, Lee, et al., pp. 208-209; 2 pages.
U.S. Appl. No. 13/430,631: "Inline Method To Monitor ONO Stack Quality" Yu Yang et al., filed Mar. 26, 2012; 51 pages.

(Continued)

*Primary Examiner* — Errol Fernandes

(57) ABSTRACT

Structures and methods are provided for determining operating characteristics of a non-volatile memory transistor comprising a charge-storage-layer and a tunneling-layer. In one embodiment, the method comprises: forming a structure including a charge-storage-layer overlying a tunneling-layer on a substrate; depositing a positive charge on the charge-storage-layer and determining a first voltage to establish a first leakage current through the charge-storage-layer and the tunneling-layer; depositing a negative charge on the charge-storage-layer and determining a second voltage to establish a second leakage current through the charge-storage-layer and the tunneling-layer; and determining a differential voltage by calculating a difference between the first and second voltages. Other embodiments are also disclosed.

12 Claims, 7 Drawing Sheets

(56) References Cited

OTHER PUBLICATIONS

International Search Report for International Application No. PCT/US13/29290 dated May 13, 2013; 2 pages.

USPTO Non Final Rejection for U.S. Appl. No. 13/430,631, filed Sep. 26, 2013; 7 pages.

Written Opinion of the International Searching Authority for International Application No. PCT/US13/29290 mailed May 13, 2013; 7 pages.

USPTO Notice of Allowance for U.S. Appl. No. 13/430,631, filed Jan. 17, 2014; 12 pages.

* cited by examiner

INLINE METHOD TO MONITOR ONO STACK QUALITY

TECHNICAL FIELD

The present disclosure relates generally to semiconductor processing and, more particularly to semiconductor devices including an oxide-nitride-oxide (ONO) stack.

BACKGROUND

Oxide-nitride-oxide (ONO) stacks are widely used as a charge storing layer in non-volatile memory (NVM) transistors, such as in silicon-oxide-nitride-oxide-silicon (SONOS) or metal-oxide-nitride-oxide-silicon (MONOS), and as an isolation layer between a floating gate and control gate in split gate flash NVM transistors. NVM transistors are programmed by applying a positive bias between a control gate and a body contact of the transistor. The positive bias causes electrons from source and drains regions of the transistor to tunnel through the lower oxide layer of the ONO stack and become trapped in the nitride layer. This results in an energy barrier between the drain and the source, raising the threshold voltage ($V_T$) of the transistor to a programmed threshold voltage ($V_{Tp}$). The NVM transistor is erased or returned to an erased threshold voltage ($V_{Te}$) by applying a negative bias between the control gate and body contact.

The difference between the programmed threshold voltage ($V_{Tp}$) and the erased threshold voltage ($V_{Te}$) of the transistor, is known as a $V_T$ window and is the typically reduced over time due to the loss of charge stored in the nitride layer. This loss can be due to several mechanisms of charge leakage. The $V_T$ window at the end of life of the part depends on the window at the beginning of life and the rate of decay with time. Thus, in order to meet a specified operating life, e.g., 17 years, the transistor must meet a specified minimum beginning of life (BOL) $V_T$ window, e.g., 3.0VDC.

The BOL $V_T$ window depends on the amount of charge stored in the nitride in the program and erase states which in turn depend on how efficiently electrons or holes are injected into the nitride layer during program and erase. An important figure of merit used to characterize quality of the ONO stack is the program/erase efficiency of the NVM transistors. By program/erase efficiency it is meant the biasing voltage and time for which it must be applied to program or erase the NVM transistor. Conventional methods of testing NVM transistors include testing a completed, packaged device, which can take weeks after deposition of an ONO stack. Thus, any problem with composition of one or more layers of the ONO stack due to a malfunction in the process or tool, even one that might be corrected in fabrication, will not be discovered for weeks resulting in lowered yield of devices meeting specified parameters and substantial loss of revenue.

BRIEF DESCRIPTION OF THE DRAWINGS

These and various other features of test structures and methods for determining ONO stack quality will be apparent upon reading of the following detailed description in conjunction with the accompanying drawings and the appended claims provided below, where:

FIGS. 5A-4C illustrate a block diagram of a tool and test setup for determining differential tunneling voltage according to an embodiment.

DETAILED DESCRIPTION

Figure 1:
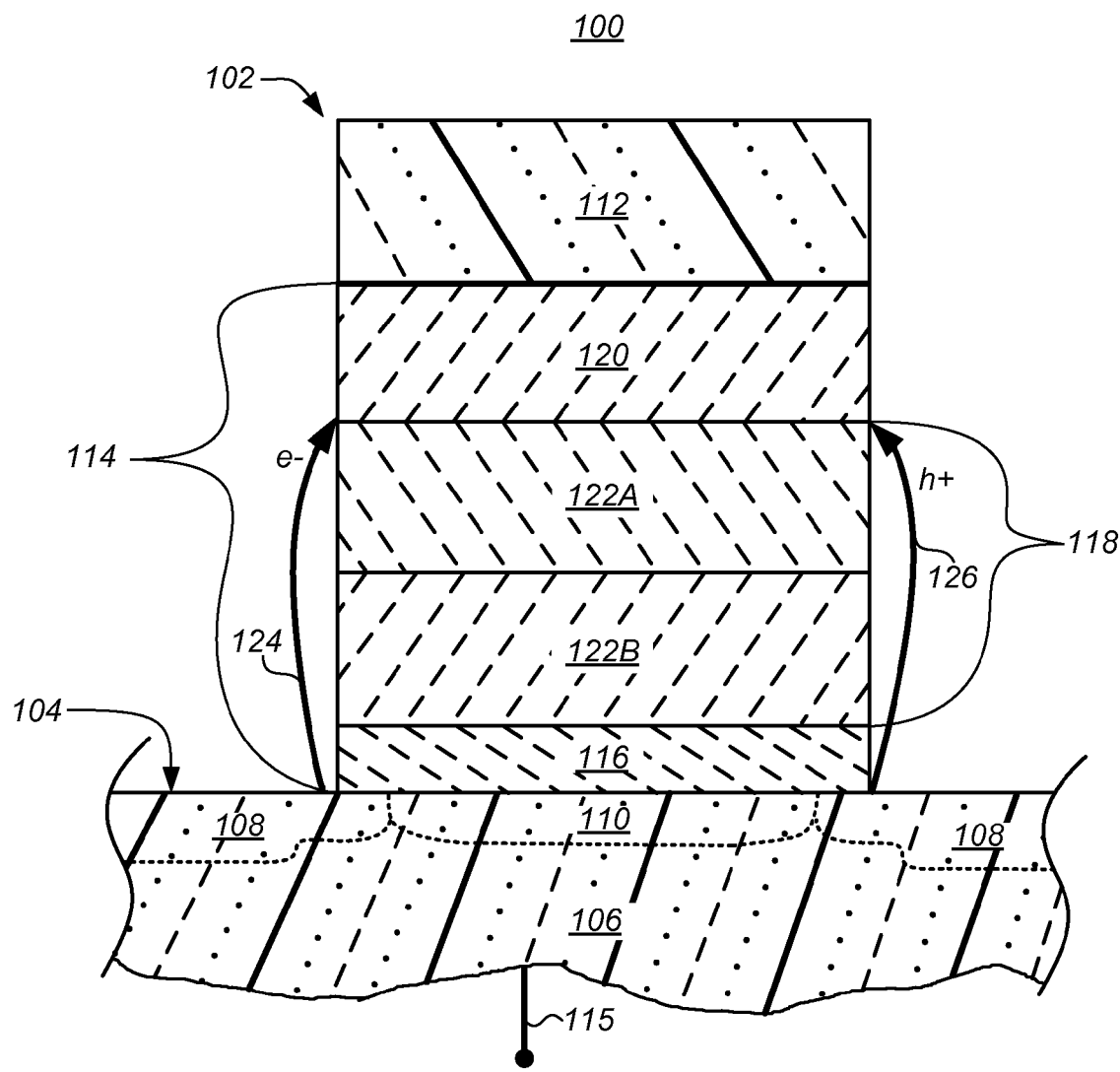
FIG. 1 is a block diagram illustrating a cross-sectional side view of an non-volatile memory (NVM) transistor for which a structure and method for testing according to an embodiment disclosed herein is particularly useful.

Structures or structures and methods for testing are provided for determining ONO stack quality and operating characteristics, such as program/erase efficiency, of non-volatile memory (NVM) transistors including an ONO stack. By ONO stack it is meant a gate stack of three or more layers including a lower tunneling-layer, one or more nitride or oxynitride charge-storage-layers, and an upper a top, high-temperature oxide (HTO) or blocking-dielectric-layer.

The drawings described are only schematic and are non-limiting. In the drawings, the size of some of the elements may be exaggerated and not drawn to scale for illustrative purposes. The dimensions and the relative dimensions may not correspond to actual reductions to practice of the invention. For purposes of clarity, many details of fabrication of semiconductor devices in general and fabrication of ONO stacks in particular, which are widely known and not relevant to the present system and method have been omitted from the following description.

FIG. 1 is a partial cross-sectional view of an intermediate structure for a semiconductor device or device 100, such as an NVM transistor, including a gate stack 102 formed over a surface 104 of a semiconductor substrate or substrate 106, such as a silicon wafer. The device 100 further includes one or more diffusion regions 108, such as source and drain regions, aligned to the gate stack 102 and separated by a channel region 110. In some embodiments, such as that shown, the gate stack 102 is a semiconductor-oxide-nitride-oxide-semiconductor (SONOS) gate stack including a semiconductor, such as polysilicon (poly), control gate 112 formed on and in contact with an ONO stack 114, and a bulk or body contact 115 to the substrate 106. The control gate 112 is separated or electrically isolated from the substrate 106 by the ONO stack 114. The ONO stack 114 generally includes a lower tunneling oxide layer or tunneling-layer 116, a charge trapping layer or charge-storage-layer 118 overlying the tunneling-layer, and a top, blocking oxide layer or blocking-dielectric-layer 120, such as a high temperature oxide (HTO) layer, overlying the charge-storage-layer.

The charge-storage-layer 118 may be a single silicon nitride or silicon oxynitride layer, or, as shown in FIG. 1, may be a multi-layer charge-storage-layer having two or more nitride or oxynitride layers, including a top-oxynitride-layer 122A and a bottom-oxynitride-layer 122B. The top-oxynitride-layer 122A is a silicon and nitrogen rich, oxygen lean oxynitride layer with a high charge trap density, and the bottom-oxynitride-layer 122B is an oxygen rich oxynitride layer. By oxygen rich it is meant the bottom-oxynitride-layer 122B has a concentration of oxygen of from about 15% to about 40%, as compared to a concentration of oxygen of less than about 5% in the top-oxynitride-layer 122A. The topoxynitride-layer 122A may have a charge trap density at least 1000 times greater than the bottom-oxynitride-layer 122B.

The substrate 106 may include any known silicon-based semiconductor material including silicon, silicon-germanium, silicon-on-insulator, or silicon-on-sapphire substrate. Alternatively, the substrate 106 may include a silicon layer formed on a non-silicon-based semiconductor material, such as gallium-arsenide, germanium, gallium-nitride, or aluminum-phosphide. In certain embodiments, the substrate 106 is a doped or undoped silicon substrate.

The lower tunneling oxide layer or tunneling-layer 116 of the ONO stack generally includes a relatively thin layer of silicon dioxide ($SiO_2$) of from about 15 angstrom (Å) to about 22 Å, and in some embodiments about 18 Å. The tunneling-layer 116 can be formed or deposited by any suitable means including, for example, being thermally grown or deposited using chemical vapor deposition (CVD). Generally, the tunneling-layer is formed or grown using a thermal oxidation in oxygen ambient. In one embodiment, the process involves a dry oxidation method in which the substrate 106 is placed in a processing chamber, heated to a temperature from about 700° C. to about 850° C., and exposed to oxygen for a predetermined period of time selected based on a desired thickness of the finished tunneling-layer 116. In another embodiment, the tunneling-layer is grown in an ISSG (In-Situ Steam Generation) chamber with a radical oxidation using a reaction between oxygen ($O_2$) and hydrogen ($H_2$) on the substrate at temperatures of at least 1000° C. Exemplary process times are from about 10 to about 100 minutes. The oxidation can be performed at atmospheric or at low pressure.

As noted above, the charge-storage-layer 118 may be a multi-layer charge storing layer including at least two silicon nitride or silicon oxynitride layers having differing compositions of silicon, oxygen and nitrogen, and having an overall thickness of from about 70 Å to about 150 Å. In one embodiment, the top-oxynitride-layer 122A and the bottom-oxynitride-layer 122B are formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen (N2), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom-oxynitride-layer 122B can be deposited over the tunneling-layer 116 by placing the substrate 106 in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom-oxynitride-layer 122B, that decreases the charge loss rate after programming and after erase, which is manifested in a small voltage shift in a data retention mode.

The top-oxynitride-layer 122A can be deposited over the bottom-oxynitride-layer 122B in a CVD process using a process gas including $N_2O$, $NH_3$ and DCS, at a chamber pressure of from about 5 mT to about 500 mT, and at a substrate temperature of from about 700° C. to about 850° C. and in certain embodiments at least about 760° C., for a period of from about 2.5 minutes to about 20 minutes. In particular, the process gas can include a first gas mixture of N2O and NH3 mixed in a ratio of from about 8:1 to about 1:8 and a second gas mixture of DCS and NH3 mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top-oxynitride-layer 122A, which improves the speed and increases of the initial difference between program and erase voltage without compromising a charge loss rate of memory devices made using an embodiment of the silicon-oxide-oxynitride-oxide-silicon structure, thereby extending the operating life of the device.

The blocking-dielectric-layer 120 may include a relatively thick layer of $SiO_2$ of from about 30 Å to about 70 Å. The blocking-dielectric-layer 120 can be formed or deposited by any suitable means including, for example, being thermally grown or deposited using CVD. In one embodiment, the blocking-dielectric-layer 120 is a high-temperature-oxide (HTO) deposited using CVD process. Generally, the deposition process involves exposing the substrate 106 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

In certain embodiments, the blocking-dielectric-layer 120 is deposited sequentially in the same tool used to form the top-oxynitride-layer 122A and the bottom-oxynitride-layer 122B. In certain embodiments, the top-oxynitride-layer 122A, the bottom-oxynitride-layer 122B, and the blocking-dielectric-layer 120 are formed or deposited in the same tool used to grow the tunneling-layer 116. Suitable tools include, for example, an ONO AVP, commercially available from AVIZA technology of Scotts Valley, Calif.

Alternatively, the blocking-dielectric-layer 120 can also be formed by thermal oxidation of part of the top-oxynitride-layer using a radical oxidation process such as In-Situ Steam Generation (ISSG). In one embodiment, forming the blocking-dielectric-layer 120 using ISSG is accomplished by placing the substrate 106 in a deposition or processing chamber, heating the substrate to a temperature from about 700° C. to about 850° C., and exposing it to a wet vapor for a predetermined period of time selected based on a desired thickness of the finished blocking-dielectric-layer 120. Exemplary process times are from about 5 to about 20 minutes. The oxidation can be performed at atmospheric or at low pressure.

Referring to FIG. 1, during programming a positive bias applied across the control gate 112 and the body contact 115 of the device 100 causes electrons from diffusion regions 108 of the device to tunnel through the tunneling-layer 116 of the ONO stack 114 and become trapped in the charge-storage-layer 118, raising the threshold voltage ($V_T$) of the device to a programmed threshold voltage ($V_{Tp}$). The region of the charge-storage-layer 118 in which the electrons become trapped, referred to as a charge reservoir, may be at or near an interface between layers in a multilayer charge-storage-layer, as shown in FIG. 1, or at any predetermined region within one of the layers or in a single layer charge-storage-layer. The location of the charge reservoir within the charge-storage-layer 118 can be determined by the stoichemetric composition of the silicon nitride or silicon oxynitride or by the inclusion of a trap inducing material, such as carbon, into the charge-storage-layer. The tunneling of the electrons during programming is represented in FIG. 1 by arrow 124. To erase the device 100, returning the device to or returned to an original erased threshold voltage ($V_{Te}$), a negative bias applied across the control gate 112 and the body contact 115 of the device 100 causing holes to tunnel from diffusion regions 108 of the device through the tunneling-layer 116 of the ONO stack 114 and become trapped in the charge-storage-layer 118. The tunneling of the holes during erase is represented in FIG. 1 by arrow 126. $V_{Tp}$ and $V_{Te}$ are determined by the amount of charge stored or trapped in charge-storage-layer 118, which is proportional to the tunneling current during program/erase, which is positively correlated to tunneling or program/erase efficiency.

Figure 2:
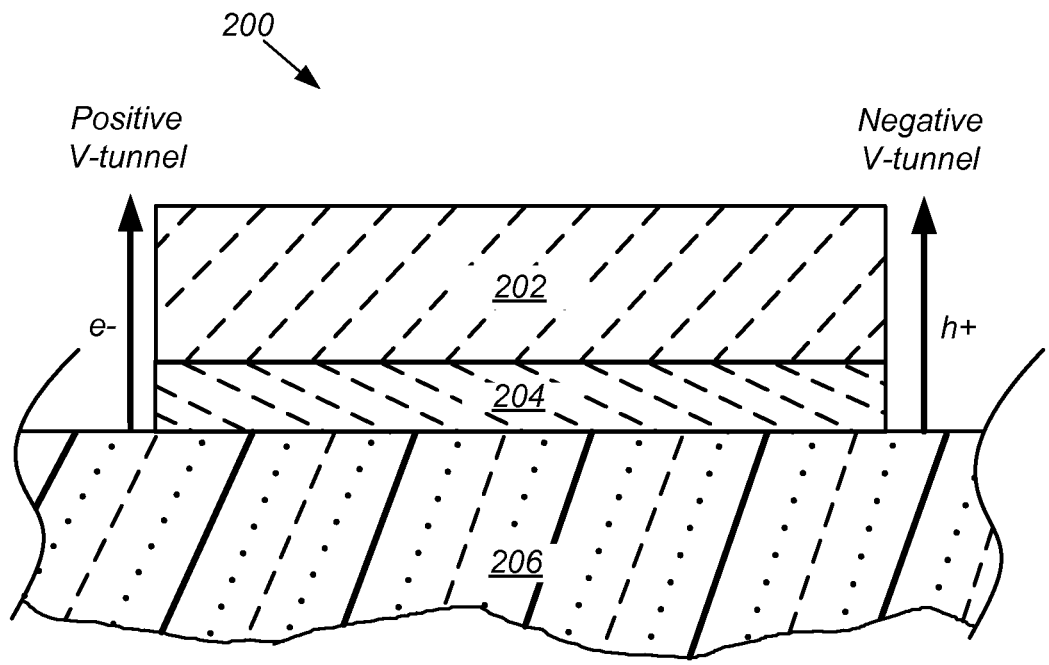
FIG. 2 is a block diagram illustrating a structure according to an embodiment.

FIG. 2 is a partial cross-sectional view of an embodiment of a test-structure or structure 200 for determining a program/erase efficiency of the NVM transistor of FIG. 1. Referring to FIG. 2, the structure 200 includes a charge-storage-layer 202 overlying a tunneling-layer 204 on a substrate 206. Generally, the charge-storage-layer 202 and tunneling-layer 204 are formed by the same processes and concurrently with the charge-storage-layer 118 and tunneling-layer 116 of the device 100 described above with respect to FIG. 1. That is the tunneling-layer 204 may include a relatively thin layer of from about 15 Å to about 22 Å $SiO_2$, thermally grown, deposited by CVD or formed by ISSG. The charge-storage-layer 202 may include one or more layers of nitride or oxynitride formed or deposited in a low pressure CVD process and having an overall thickness of from about 70 Å to about 150 Å. It will be understood that the specific composition and size or thicknesses of the charge-storage-layer 202 and tunneling-layer 204 are generally chosen to mirror or be substantially the same as the formed charge-storage-layer 118 and tunneling-layer 116 of the device 100 with which they are concurrently formed by the same processes in the same processing tools.

In embodiments where charge-storage-layer 118 of the device 100 is a multi-layer charge-storage-layer 118 having two or more nitride or oxynitride layers, as shown in FIG. 1, the charge-storage-layer 202 of the structure 200 may include a multi-layer charge-storage-layer (not shown) or a charge-storage-layer 202 corresponding only to the bottom-oxynitride-layer 122B of the multi-layer charge-storage-layer. In either embodiment, the structure 200 can be formed either by removing a wafer or substrate on which the structure is formed from processing following deposition of the charge-storage-layer 118 (or bottom-oxynitride-layer 122B) of the device 100, or by removing the blocking-dielectric-layer 120 (not shown in this figure) from the charge-storage-layer 202.

Figure 3:
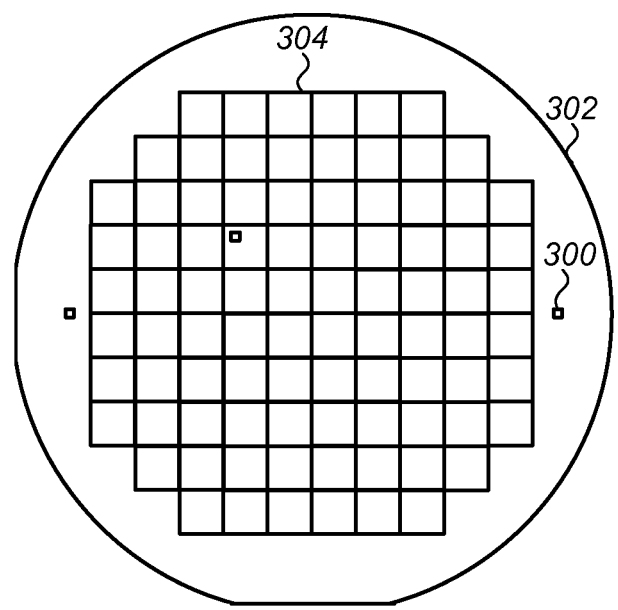
FIG. 3 is a plan view of a substrate illustrating locations of structures relative to semiconductor memories each of which include multiple NVM transistors according to an embodiment.

Referring to FIG. 3 in some embodiments, structures 300 are formed on a shared product wafer or substrate 302 on which a number of integrated circuits (ICs 304), such as semiconductor memories, each of which include multiple NVM transistors (not shown in this figure) are formed. In these embodiments, the charge-storage-layer 202 and tunneling-layer 204 of the structure may be formed from and include substantially the same oxide, nitride or oxynitride layers included in the charge-storage-layer 118 and tunneling-layer 116 of the device 100. In one embodiment, the structures 300 are complete and testing performed after the charge-storage-layer 202 and tunneling-layer 204 are formed prior to forming the blocking-dielectric-layer 120 of the device 100. In an alternative embodiment, the structures 300 are completed and testing performed after removing or forming an opening through a portion of the blocking-dielectric-layer 120 formed over the structure while leaving the NVM transistors of the ICs 304 substantially covered by at least the blocking-dielectric-layer 120. This embodiment advantageously shields the NVM transistors of the ICs 304 from possible damage during testing. The blocking-dielectric-layer 120 can be removed using standard photolithographic techniques followed by a wet etch or process which has high etch selectivity of oxide to nitride or oxynitride. For example, the wet etch can be performed using a buffered oxide etch (BOE) wet etch, a hydrofluoric (HF) wet etch, a pad etch, or any other similar hydrofluoric-based wet oxide etching chemistry.

The structures 300 can be formed outside of a region or area in which the ICs 304 are formed, or in boxes or open areas inside one or more of the ICs. In certain embodiments, it may be advantageous to provide a structure inside an open area in each IC 304.

In another embodiment, structures 300 may be formed on a separate monitor substrate (not shown) or wafer that is processed concurrently along with a one or more product substrates or wafers on which a number of ICs each including multiple NVM transistors are formed.

Whether formed on a separate monitor substrate or on a shared product wafer or substrate 302, the structure 200 can be used to measure a positive and a negative tunneling voltage at the same or neighboring sites. The difference between the positive and negative tunneling voltage is the differential tunneling voltage, which is a measurement of the tunneling efficiency through the tunneling-layer 204 and charge-storage-layer 202 oxynitride and is directly related to the device program/erase efficiency, and strongly correlated to the device $V_T$ window.

Figure 4:
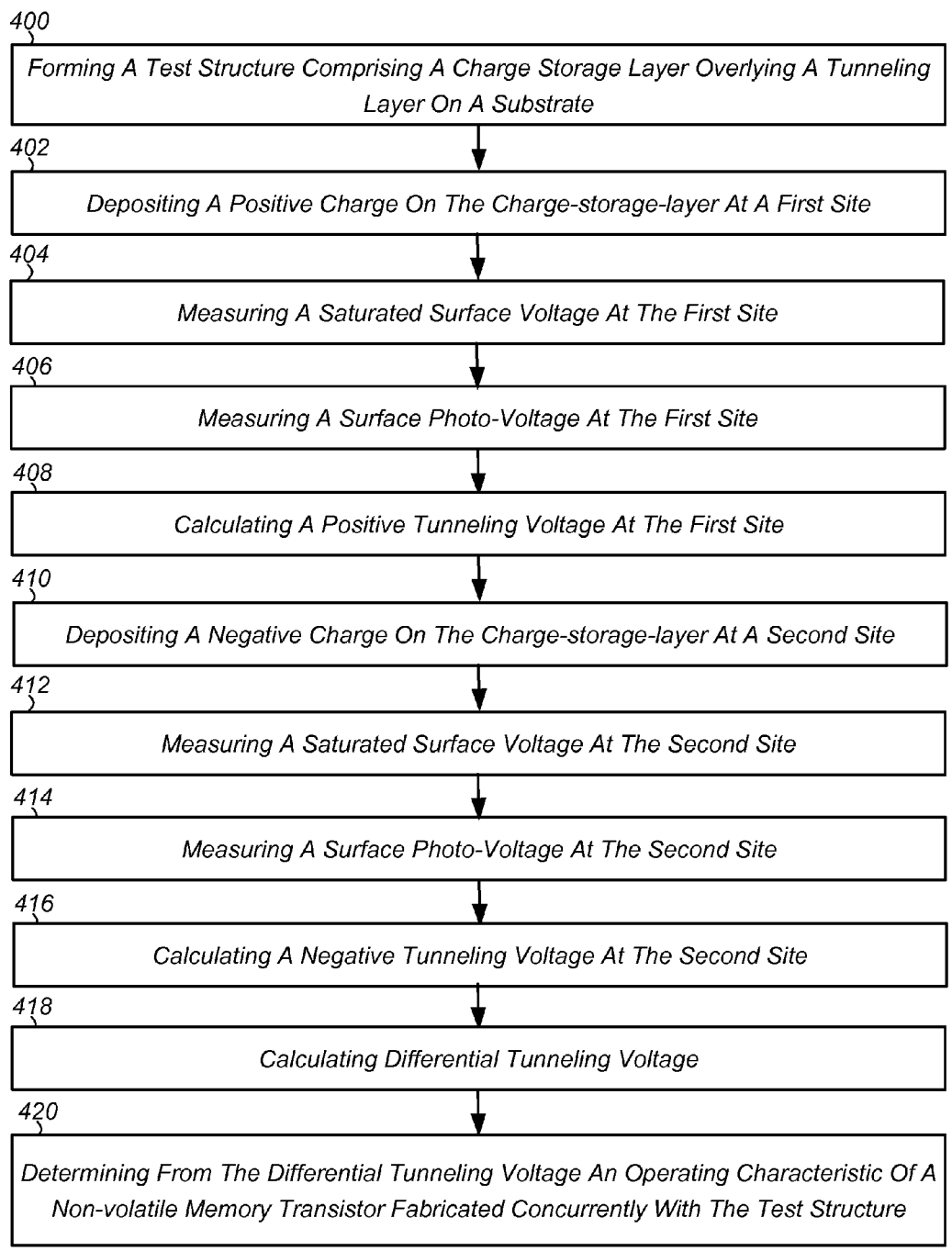
FIG. 4 is a flowchart illustrating a method of determining ONO stack quality according to an embodiment.

A method for inline monitoring of ONO stack quality, and more particularly determining the differential tunneling voltage, which is directly related to the device program/erase efficiency and strongly correlated to the device VT window, according to one embodiment will now be described with reference to FIG. 4. Prior methods of measuring tunneling voltage require contact measurement of the voltage applied across the charge-storage-layer and tunneling-layer to achieve a pre-determined tunneling current, and hence are not suitable for inline methods to monitor ONO stack quality. FIG. 4 is a flowchart illustrating a corona charge method of determining the differential tunneling voltage of an ONO stack of a NVM transistor according to one embodiment.

Referring to FIG. 4, the method begins with forming a structure comprising a charge-storage-layer overlying a tunneling-layer on a substrate. (Block 400) As detailed above, the substrate on which the structure is formed can be either a monitor wafer or product wafer. The structure can be formed either by performing the testing immediately following the formation of the charge-storage-layer and tunneling-layer prior to forming a blocking-dielectric-layer over the charge-storage-layer, or by removing at least a portion of the blocking-dielectric-layer to expose the structure.

A positive tunneling voltage ($^+V_{TV}$) is determined by depositing a positive charge on the charge-storage-layer at a first site in the structure until a saturated surface voltage ($V_{surf}$) is reached at the surface of the charge-storage-layer, (Block 402), and measuring the surface voltage. (Block 404) By saturated surface voltage ($V_{surf}$) it is meant the voltage at which tunneling current becomes substantial, and any further increase in voltage due to applied charge is rapidly lost due to an exponential increase in the tunneling current. Next, a Surface Photo-Voltage (SPV) is measured to account for voltage generated in the substrate underlying the charge-storage-layer and the tunneling-layer, (Block 406), and the positive tunneling voltage is calculated by summing $V_{surf}$ and SPV. (Block 408) When the program efficiency is high, the tunneling current is higher and the voltage at which the tunneling becomes substantial is lower. Thus positive tunneling voltage will be lower when the program efficiency is higher. Embodiments of methods for depositing a charge on the charge-storage-layer, measuring $V_{surf}$ and SPV are described in detail below with reference to the corona charge based electrical monitoring tool of FIGS. 5A-5C.

Next, a negative tunneling voltage ($^-V_{TV}$) is similarly determined by depositing a negative charge on the charge-storage-layer at the same site or a second site on the structure, adjacent to the first (Block 410), measuring the saturated surface voltage ($V_{surf}$) on the charge-storage-layer (Block 412), measuring the surface photo-voltage (SPV) (Block 414), and calculating the negative tunneling voltage by summing $V_{surf}$ and SPV. (Block 416). In this case also, when the erase efficiency is higher, the tunneling current will be higher and becomes substantial at a lower voltage. Thus the negative tunneling voltage will be lower when the erase efficiency is higher.

Although, determining the positive and negative voltages are described as being performed using a corona charge method it will be understood that the positive and negative voltages can also be determined using other non-contact methods or methods that do not require formation of diffusion regions or contacts to the structure for testing. It will be understood that although described as being performed at neighboring first and second test sites, measurements for determination of the positive and negative voltages can also be performed at the same site if material damaging by the first tunneling voltage measurement is minimal and substantially does not affect the subsequent tunneling voltage measurement.

A differential tunneling voltage ($\Delta V_{TV}$) is then determined by calculating a difference between the positive tunneling voltage and negative tunneling voltage. (Block 418) Optionally, the determining the differential tunneling voltage ($\Delta V_{TV}$) (Block 418) further includes halting fabrication of NVM transistors formed concurrently with the structure when the differential tunneling voltage is outside a specified range of voltages. An operating characteristic, i.e., the program/erase efficiency and/or the $V_T$ window, of a non-volatile memory transistor including a charge-storage-layer and a tunneling-layer fabricated concurrently with the structure is then determined using the differential tunneling voltage. (Block 420). In particular, as noted above the differential tunneling voltage is a measurement of the tunneling efficiency through the bottom half of the ONO stack, i.e., the charge-storage-layer and tunneling-layer, which is strongly correlated to the program/erase efficiency of the NVM transistor under fixed program/erase conditions. Moreover, the higher differential tunneling voltage, the less tunneling current (at a pre-determined program/erase voltage) and therefore the smaller the $V_T$ window. Thus, the differential tunneling voltage is strongly correlated to the device $V_T$ window. An embodiment of a method for determining an operating characteristic of a NVM transistor using the differential tunneling voltage is described in below with reference to the graph of FIG. 6.

A tool and test setup for determining or measuring tunneling voltage according to one embodiment is now described with reference to FIGS. 5A-5C.

Figure 5A:
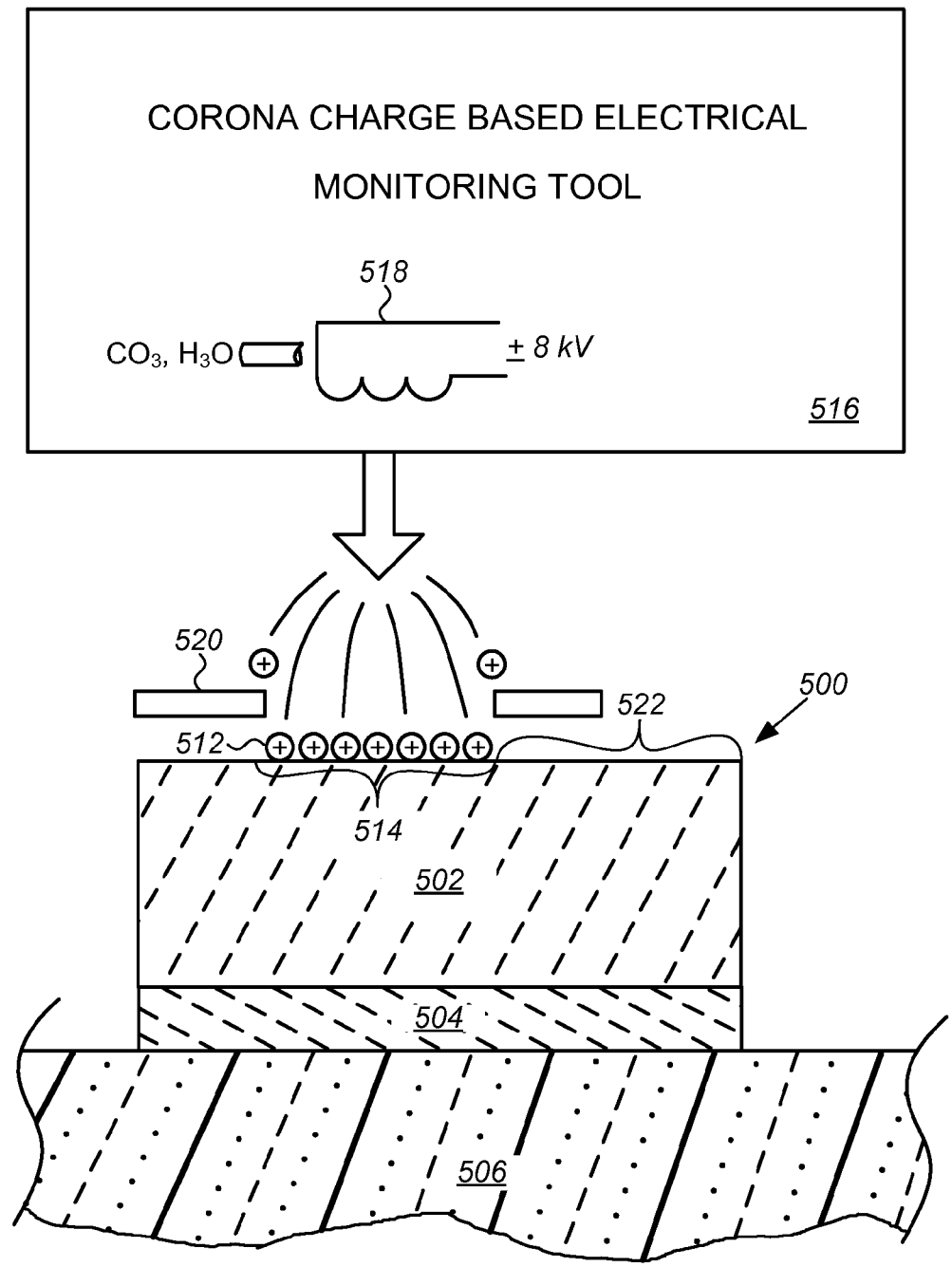
Figure 5B:
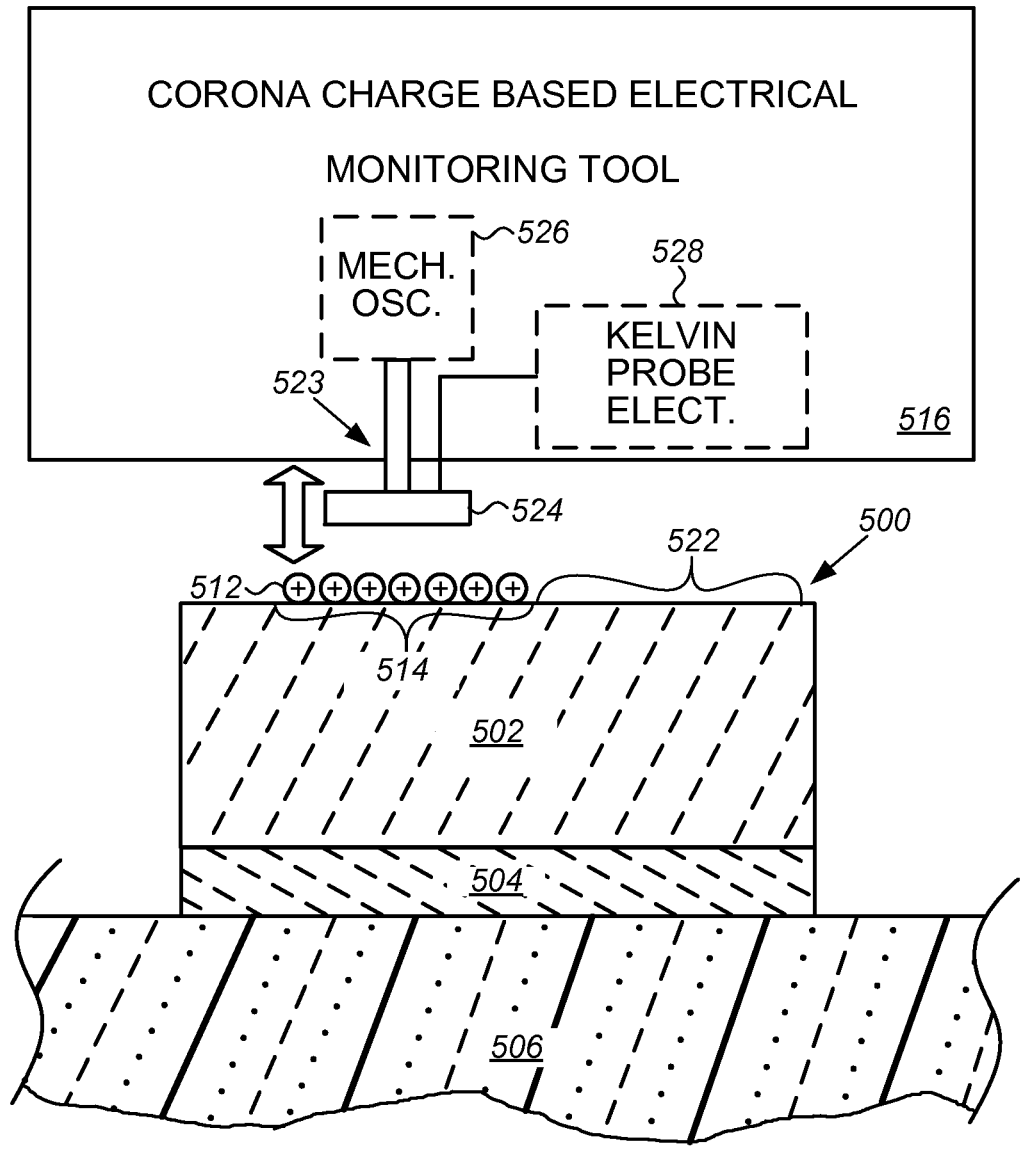
Figure 5C:
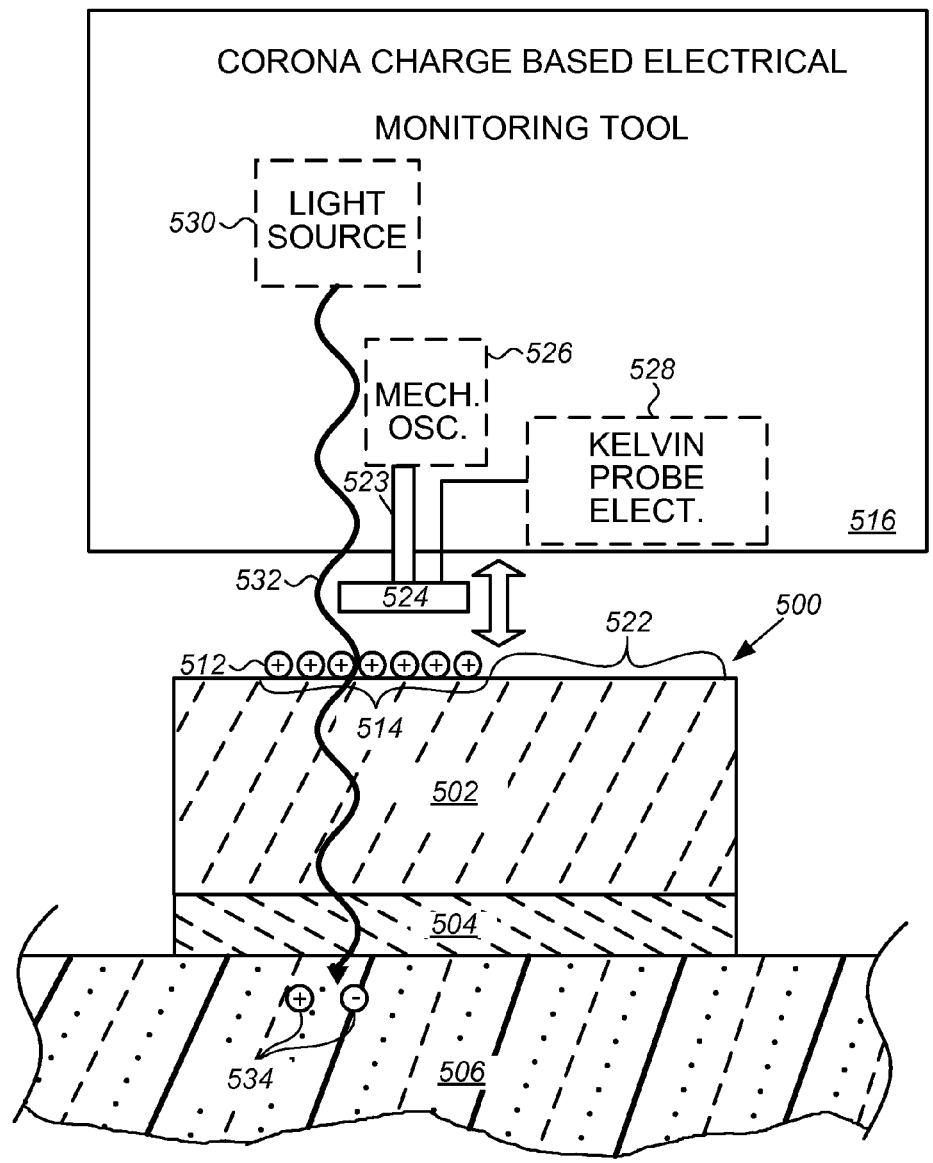

Referring to FIG. 5A, prior to testing a structure 500 including a charge-storage-layer 502 overlying a tunneling-layer 504 is formed on a substrate 506. As detailed above, the substrate 506 on which the structure 500 is formed can be either a monitor wafer or product wafer. The structure 500 can be formed either by performing the testing immediately following the formation of the tunneling-layer 504 and charge-storage-layer 502 prior to forming a blocking-dielectric-layer (not shown in this figure) over the charge-storage-layer, or by removing at least a portion of the blocking-dielectric-layer to expose the structure.

A charge 512, shown here as a positive charge, is deposited on the charge-storage-layer 502 at a first site 514 on the structure 500. The charge 512 can be formed or generated and deposited on the charge-storage-layer 502 using a corona charge based electrical monitoring tool or tool 516. Suitable tools include, for example, a Quantox XP, commercially available from KLA-Tencor of San Jose, Calif. Generally, the charge 512 is generated by ionizing air molecules using a high voltage needle or electrode 518 to which either a positive or negative voltage is applied. Ions used to supply the charge can include carbon trioxide ($CO_3$) or hydronium ($H_3O$) ions, such as $CO_3^-$ or $H_3O^+$, generated directly from the atmosphere, or can include ions formed from other source material directly supplied from a source to the tool.

Generally, as shown in FIG. 5A, the test setup or tool 516 further includes a mask or shield 520 to direct or focus the charge towards the first site 514 on the structure 500, and shield adjacent areas of the structure 500, including a second site 522, from the charge 512 deposited on the first site 514. The shield 520 further defines a fixed measurement area to ensure a repeatable measurement.

Next, after a charge 512 has been deposited on the charge-storage-layer 502 a voltage at the surface ($V_{surf}$) of the charge-storage-layer 502 at the first site 514 is measured using a noncontact method. In one embodiment, $V_{surf}$ is measured using a mechanically oscillating Kelvin probe in the tool 516. Referring to FIG. 5B, the Kelvin probe generally includes a Kelvin probe or probe 523 including a capacitor plate 524 connected to the tip of the probe, which is held in proximity to the surface of the charge-storage-layer 502, and oscillated or moved in the direction indicated by a mechanical oscillator 526 and Kelvin probe electronics or probe-electronics 528. Probe oscillation and capacitive coupling between the capacitor plate 524 and the charge 512 on the charge-storage-layer 502 drives an alternating or varying current in the probe from which $V_{surf}$ can be determined or measured in the probe-electronics 528.

Finally, a surface photovoltage (SPV) is measured to obtain information about the electrical field or voltage generated in the substrate 506 underlying the charge-storage-layer 502 and the tunneling-layer 504. Referring to FIG. 5C, in one embodiment the tool 516 further includes a light source 530 to emit electromagnetic radiation with photon energy greater than the silicon's bandgap (light 532) to briefly flash or illuminate at least a portion of the structure 500, generating photogenerated carriers 534 near the silicon substrate surface. The probe 523, probe-electronics 528 and mechanical oscillator 526 are then used to measure a change in measured surface voltage which is the SPV. The SPV measures the voltage drop near the silicon substrate surface due to band bending induced by the charge deposited. Therefore, the sum of the $V_{surf}$ and SPV is the voltage across the charge storage layer and the tunneling layer.

When a sufficiently large amount of corona charge is deposited, the surface voltage ($V_{surf}$) will be saturated to a point at which tunneling current becomes substantial. Any deposited charge in excess of this amount is rapidly lost or dissipated by an exponential increase in the tunneling current. Thus, the tunneling voltage can be calculated as the sum of the $V_{surf}$ and SPV at the point of surface voltage saturation.

Figure 6:
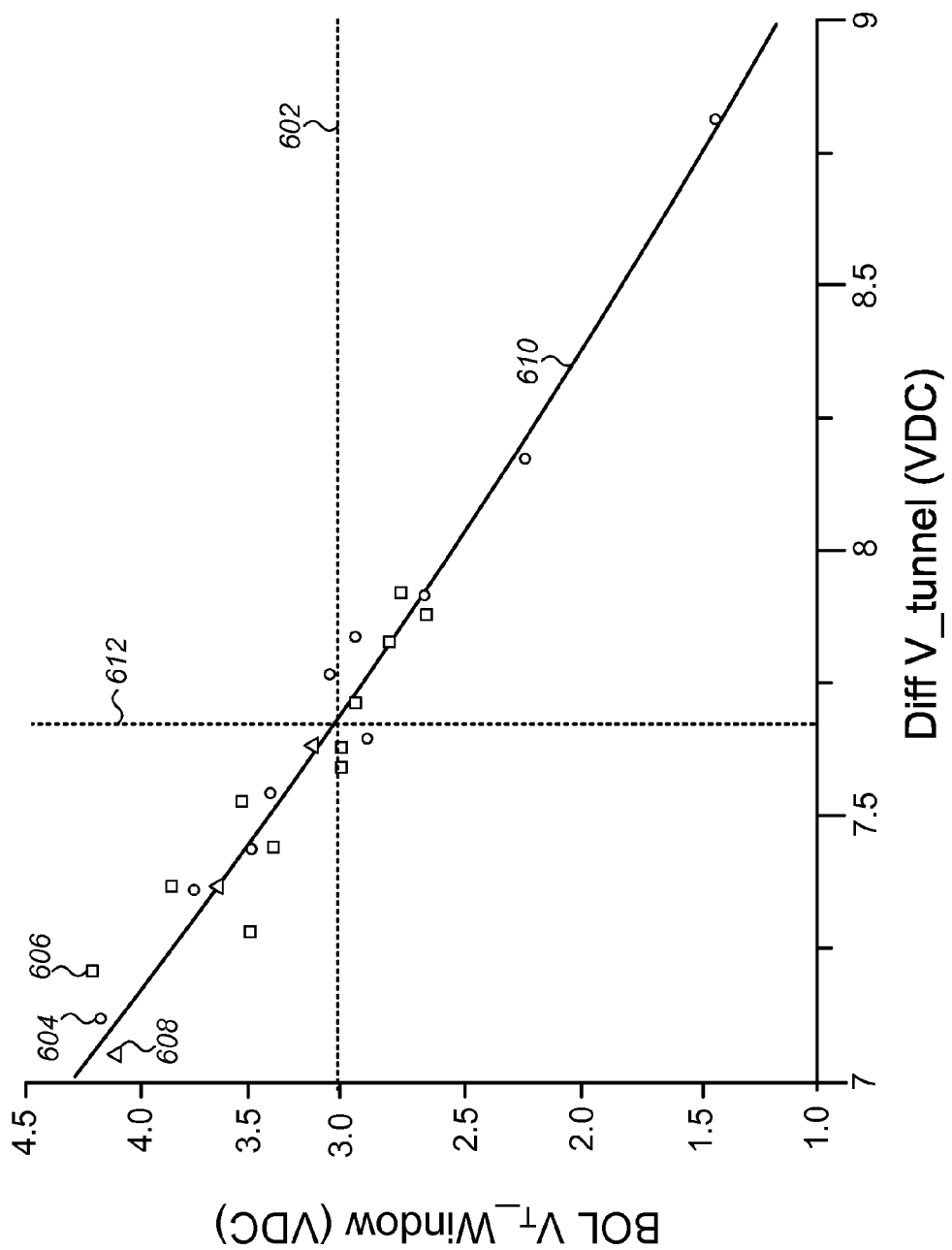
FIG. 6 is graph illustrating the correlation of a differential tunneling voltage determined according to an embodiment of the present disclosure to a threshold voltage ($V_T$) window of transistor including an ONO stack.

FIG. 6 is graph illustrating the correlation of a differential tunneling voltage determined according to an embodiment of the present disclosure to a measured beginning-of-life (BOL) threshold voltage ($V_T$) window of transistor including an ONO stack. By $V_T$ window it is meant the difference between a programmed threshold voltage ($V_{TP}$) of a NVM transistor and an erased threshold voltage ($V_{TE}$). The $V_T$ window of a NVM transistor is the typically reduced over time due to the loss of charge stored in the nitride layer. This loss can be due to several mechanisms of charge leakage. The $V_T$ window at the end of life of the part depends on the window at the beginning of life and the rate of decay with time. Thus, an NVM transistor in order to meet a specified operating life, e.g., 17 years, must meet a specified minimum BOL $V_T$ window, e.g., 3.0VDC.

Referring to FIG. 6, the Y axis represents the BOL $V_T$ window in volts for a number of NVM transistors measured after completion and/or packaging of the NVM transistors using a conventional $V_T$ window testing method, which as noted above can take can take weeks to yield results. The X axis represents results of differential tunneling voltage (Diff V_tunnel) tests for the same NVM transistors performed on monitor substrates or test boxes on the product substrates during processing according to an embodiment of the above described method. Horizontal dashed line 602 represents a specified minimum BOL $V_T$ window. NVM transistors having a measured BOL $V_T$ window greater than this specified minimum BOL $V_T$ window, about 3.0 VDC, pass the conventional $V_T$ window E-test performed following completion of the NVM transistors. NVM transistors having a measured BOL $V_T$ window less than this specified minimum BOL $V_T$ window are said to fail the E-test. Referring to FIG. 6, symbols, including circles 604, squares 606 and triangles 608, are used to plot measured $V_T$ window versus differential tunneling voltage for NVM transistors fabricated using different processing tools, process recipes and process ranges. In particular, circles 604 represent $V_T$ window versus differential tunneling voltage for NVM transistors produced on a first processing tool, squares 606 represent $V_T$ window versus differential tunneling voltage for NVM transistors produced on a second processing tool, and triangles 608 for NVM transistors produced on a third processing tool. Graph 610 represent a best fit for $V_T$ window versus differential tunneling voltage for NVM transistors fabricated on each of the three separate processing tools using process recipes and process ranges. Referring to FIG. 6, it is seen that graph 610 crosses horizontal dashed line 602 (the specified minimum BOL $V_T$ window) at a point on the X axis corresponding to about 7.7 VDC, represented by vertical dashed line 612. Therefore, using an embodiment of the differential tunneling voltage measurement method described above, and the correlation of FIG. 6, it is possible to predict and monitor the performance of NVM transistors inline, without waiting until fabrication is complete and all measurements made. That is when the measured differential tunneling voltage is greater than a specified maximum voltage, shown here as about 7.7 VDC, it can be predicted that the BOL $V_T$ window will be less than the specified 3.0 VDC.

It is further noted that the correlation is universal, and is independent of the process recipe in a certain process range, and of the ONO process tools used.

Thus, embodiments of methods for inline monitoring of program/erase efficiency of an ONO stack have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method comprising:
    forming a structure including a charge-storage-layer overlying a tunneling-layer on a substrate;
    depositing a positive charge at a first site on the uppermost surface of the charge-storage-layer and determining a first voltage to establish a first leakage current through the charge-storage-layer and the tunneling-layer;
    depositing a negative charge at a second site on the uppermost surface of the charge-storage-layer and determining a second voltage to establish a second leakage current through the charge-storage-layer and the tunneling-layer; and
    determining a differential voltage by calculating a difference between the first and second voltages.

2. The method of claim 1, wherein the first site is proximal to the second site.

3. The method of claim 1, wherein forming the structure comprises removing a blocking-dielectric-layer overlying the charge-storage-layer.

4. The method of claim 1, wherein the charge-storage-layer comprises one or more nitride layers.

5. The method of claim 1, wherein the charge-storage-layer comprises one or more oxynitride layers.

6. A method comprising:
forming a structure including a charge-storage-layer overlying a tunneling-layer on a substrate;
depositing a positive charge on the uppermost surface of the charge-storage-layer and determining a first voltage to establish a first leakage current through the charge-storage-layer and the tunneling-layer;
depositing a negative charge on the uppermost surface of the charge-storage-layer and determining a second voltage to establish a second leakage current through the charge-storage-layer and the tunneling-layer;
determining a differential voltage by calculating a difference between the first and second voltages; and
determining from the differential tunneling voltage an operating characteristic of a non-volatile memory nonvolatile memory transistor comprising a charge-storage-layer and a tunneling-layer fabricated concurrently with the charge-storage-layer and tunneling-layer of the structure,
wherein forming the structure comprises forming the structure on a monitor substrate processed concurrently with a product substrate on which the non-volatile memory transistor is fabricated.

7. A method comprising:
forming a structure including a charge-storage-layer overlying a tunneling-layer on a substrate, wherein forming the structure comprises removing a blocking-dielectric-layer overlying the charge-storage-layer;
depositing a positive charge on the uppermost surface of the charge-storage-layer and determining a positive tunneling voltage for the structure;
depositing a negative charge on the uppermost surface of the charge-storage-layer and determining a negative tunneling voltage for the structure;
determining a differential tunneling voltage by calculating a difference between the positive and negative tunneling voltage; and
determining from the differential tunneling voltage an operating characteristic of a non-volatile memory transistor comprising a charge-storage-layer and a tunneling-layer fabricated concurrently with the charge-storage-layer and tunneling-layer of the structure.

8. The method of claim 7, wherein forming the structure comprises forming the structure on a product substrate on which the non-volatile memory transistor is fabricated.

9. The method of claim 7, wherein the charge-storage-layer comprises one or more nitride layers.

10. The method of claim 7, wherein the charge-storage-layer comprises one or more oxynitride layers.

11. The method of claim 7, further comprising halting fabrication of nonvolatile memory transistors formed concurrently with the structure when the differential tunneling voltage is outside a specified range of voltages.

12. A method comprising:
forming a structure including a charge-storage-layer overlying a tunneling-layer on a substrate;
depositing a positive charge on the uppermost surface of the charge-storage-layer and determining a positive tunneling voltage for the structure;
depositing a negative charge on the uppermost surface of the charge-storage-layer and determining a negative tunneling voltage for the structure;
determining a differential tunneling voltage by calculating a difference between the positive and negative tunneling voltage; and
determining from the differential tunneling voltage an operating characteristic of a non-volatile memory transistor comprising a charge-storage-layer and a tunneling-layer fabricated concurrently with the charge-storage-layer and tunneling-layer of the structure,
wherein forming the structure comprises forming the structure on a monitor substrate processed concurrently with a product substrate on which the non-volatile memory transistor is fabricated.

* * * * *